(12) United States Patent
Lee et al.

(10) Patent No.: US 8,410,587 B2
(45) Date of Patent: Apr. 2, 2013

(54) INTEGRATED CIRCUIT PACKAGE SYSTEM

(75) Inventors: Taesung Lee, Seoul-si (KR); Jae Soo Lee, Icheon-si (KR); Geun Sik Kim, Gilbert, AZ (US)

(73) Assignee: STATS ChipPAC Ltd., Singapore (SG)

( * ) Notice: Subject to any disclaimer, the term of this patent is extended or adjusted under 35 U.S.C. 154(b) by 81 days.

(21) Appl. No.: 12/544,578

(22) Filed: Aug. 20, 2009

(65) Prior Publication Data

US 2009/0309198 A1 Dec. 17, 2009

Related U.S. Application Data

(63) Continuation of application No. 11/307,313, filed on Jan. 31, 2006, now Pat. No. 7,615,851.

(60) Provisional application No. 60/594,614, filed on Apr. 23, 2005.

(51) Int. Cl.
*H01L 23/48* (2006.01)

(52) U.S. Cl. ........ 257/666; 257/667; 257/668; 257/669; 257/670; 257/671; 257/672; 257/673; 257/674; 257/675; 257/676; 257/778; 257/784; 257/E23.038; 257/E21.499; 257/E21.503; 257/E23.031; 438/123; 438/124

(58) Field of Classification Search .......... None
See application file for complete search history.

(56) References Cited

U.S. PATENT DOCUMENTS

| | | | |
|---|---|---|---|
| 4,842,662 A * | 6/1989 | Jacobi | 228/110.1 |
| 5,428,889 A | 7/1995 | Mita et al. | |
| 5,442,229 A * | 8/1995 | Mori et al. | 257/666 |
| 5,541,446 A * | 7/1996 | Kierse | 257/666 |
| 5,554,886 A * | 9/1996 | Song | 257/666 |
| 5,594,234 A | 1/1997 | Carter, Jr. et al. | |
| 5,677,567 A | 10/1997 | Ma et al. | |
| 6,080,264 A | 6/2000 | Ball | |
| 6,163,076 A | 12/2000 | Lee et al. | |
| 6,211,462 B1 | 4/2001 | Carter, Jr. et al. | |
| 6,225,683 B1 | 5/2001 | Yalamanchili et al. | |
| 6,303,981 B1 * | 10/2001 | Moden | 257/666 |
| 6,303,997 B1 * | 10/2001 | Lee | 257/778 |
| 6,427,976 B1 | 8/2002 | Huang et al. | |
| 6,674,154 B2 | 1/2004 | Minamio et al. | |
| 6,750,080 B2 * | 6/2004 | Masuda et al. | 438/106 |
| 7,253,508 B2 * | 8/2007 | Liu et al. | 257/678 |
| 7,436,049 B2 | 10/2008 | Youn et al. | |
| 2001/0054751 A1 * | 12/2001 | Toyosawa | 257/668 |
| 2002/0027267 A1 | 3/2002 | Lin et al. | |
| 2002/0132390 A1 | 9/2002 | Harrison et al. | |
| 2003/0020148 A1 | 1/2003 | Kiyohara | |
| 2003/0067067 A1 * | 4/2003 | Miyaki et al. | 257/692 |
| 2003/0178717 A1 * | 9/2003 | Singh | 257/696 |
| 2004/0061202 A1 | 4/2004 | Shim et al. | |
| 2004/0100772 A1 * | 5/2004 | Chye et al. | 361/702 |
| 2005/0133896 A1 * | 6/2005 | Liu et al. | 257/678 |

* cited by examiner

*Primary Examiner* — Fei Fei Yeung Lopez

(74) *Attorney, Agent, or Firm* — Ishimaru & Associates LLP

(57) ABSTRACT

An integrated circuit package system includes a leadframe with leads configured to provide electrical contact between an integrated circuit chip and an external electrical source. Configuring the leads to include outer leads, down set transitional leads, and down set inner leads. Connecting the integrated circuit chip electrically to the down set inner leads. Depositing an encapsulating material to prevent exposure of the down set inner leads.

19 Claims, 5 Drawing Sheets

INTEGRATED CIRCUIT PACKAGE SYSTEM

CROSS-REFERENCE TO RELATED APPLICATION(S)

This application is a continuation of U.S. patent application Ser. No. 11/307,313 filed Jan. 31, 2006, now U.S. Pat. No. 7,615,851, which claims the benefit of U.S. Provisional Patent Application Ser. No. 60/594,614 filed Apr. 23, 2005, and the subject matter thereof is hereby incorporated herein by reference thereto.

TECHNICAL FIELD

The present invention relates generally to integrated circuits, and more particularly to integrated circuit packaging.

BACKGROUND ART

Conventional flip chip quad flat nonleaded packages ("FC-QFN") have reached a stage of maturity where numerous systems have been disclosed over the last few years. Generally, an integrated circuit ("IC") chip is mounted on a leadframe and molded using epoxy molding compound ("EMC"). Interconnections are used to electrically connect the IC chip to the leadframe using solder joints, including gold stud bumps or solder bumps.

The leadframe consists of a paddle in the center and leads on the outside. The leads are divided into two sides. One side is an inner lead that electrically connects to the IC chip. The other side is an exposed terminal that electrically connects the package to other packages or the printed wiring board.

Inner leads are half-etched and encapsulated in order to prevent exposure to the outside. The leadframe thickness of half-etched inner lead design is required to be of a relatively high thickness in order to safely handle and process. Thus, high thickness leadframes are one barrier to reducing package size. In addition, thin leadframes are difficult to half-etch due to distortion or deformation of shape.

The leadframes, IC chip, and interconnects are all encapsulated in an epoxy. The epoxy encapsulates the entire FC-QFN, including the gap between the leadframe and the IC chip. However, the gap is very narrow and hard to fill without voids or delaminations. Therefore, a specially designed EMC or vacuum assisted molding machine is used, which increases assembly cost.

Thus, a need still remains for a thin leadframe structure with strong durability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including a leadframe with leads configured to provide electrical contact between an integrated circuit chip and an external electrical source. Configuring the leads to include outer leads, down set transitional leads, and down set inner leads. Connecting the integrated circuit chip electrically to the down set inner leads. Depositing an encapsulating material to prevent exposure of the down set inner leads.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
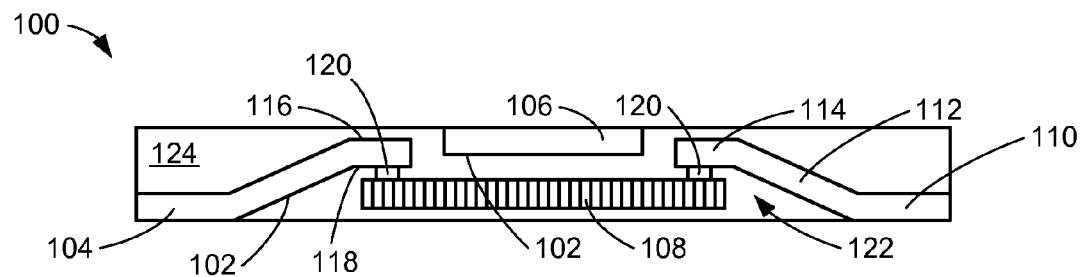
FIG. 1 is a cross-sectional view of an integrated circuit package system in accordance with an embodiment of the present invention.

The following embodiments are described in sufficient detail to enable those skilled in the art to make and use the invention, and it is to be understood that other embodiments would be evident based on the present disclosure and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. For example, the plan view shows merely as rectangles and does not provide useful information. Likewise, the drawings showing embodiments of the invention are semi-diagrammatic and not to scale and, particularly, some of the dimensions are for the clarity of presentation and are shown exaggerated in the drawing FIGs. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the plane or surface of the outer leads, regardless of their orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in accordance with an embodiment of the present invention. The integrated circuit package system 100 includes a leadframe 102, leads 104, a paddle 106, such as, a down set paddle, an integrated circuit chip 108, outer leads 110, down set transition leads 112, down set inner leads 114, a top surface 116, a bottom surface 118, interconnections 120, a cavity 122 and an encapsulating material 124.

The leadframe 102 includes the leads 104 and the paddle 106. The leads 104 fan out from the integrated circuit chip 108 to the periphery of the package. The leads 104 may terminate at the periphery of the package, and create, for example, a quad flat non-leaded package (QFN), or the leads 104 may extend beyond the periphery of the package, and create, for example, a quad flatpack package (QFP). Both of the QFN and QFP package structures may employ flip chip technology. However, it is to be understood that the formation of a QFN or QFP structure is not essential, what is important is that the down set leadframe employed by the present invention reduce the overall size dimensions of the chosen package structure.

For instance, the present invention covers a wide range of semiconductor package configurations, including multiple chips with various sizes, dimensions and electrical lead formations, such as package-in-package (PiP) configurations. The PiP system is a 3D package system that stacks a fully tested Internal Stacking Module (ISM) on top of a Base Assemble Package (BAP) to form a single Chip Scale Package (CSP).

The leads 104 are comprised by the outer leads 110, the down set transition leads 112, and the down set inner leads 114. The down set inner leads 114 include the top surface 116 and the bottom surface 118. The outer leads 110 may electrically connect the integrated circuit package system 100 to external electrical sources, such as, other packages or a printed wiring board, for example. The down set transition leads 112 connect the outer leads 110 to the down set inner leads 114. The down set inner leads 114 can be bent or down set to a depth of about 0.100 mm to about 1.000 mm below the plane established by the outer leads 110. The paddle 106 can be down set to a depth of about 0.150 mm to about 1.100 mm below the plane established by the outer leads 110. By being down set in such manner, the down set inner leads 114 and the paddle 106 will not be exposed after encapsulation.

The leads 104 and the paddle 106, of the present invention, can be manufactured by techniques well known in the art, such as, stamping.

The leads 104 and the paddle 106 may be made of any material with properties of malleability and conductivity that are favorable to the process steps of the present invention.

FIG. 1 further depicts the integrated circuit chip 108 electrically connected to the bottom surface 118 of the down set inner leads 114 by the interconnections 120. By way of example, the integrated circuit chip 108 can overlap a portion of the down set inner leads 114 and the interconnections 120 can be formed by solder balls. Accordingly, in an aspect of the present invention, the integrated circuit chip 108 can be a flip chip, such as, a digital signal processor (DSP), an application specific integrated circuit (ASIC), or a micro-processor chip. However, it is to be understood that the integrated circuit chip 108 need not be a flip chip. What is important is that the integrated circuit chip 108 be of any chip configuration that can electrically connect to the down set inner leads 114. Additionally, although FIG. 1 only depicts one IC chip, multiple IC chips may be formed over the leadframe 102, wherein the number of IC chips formed over the leadframe 102 is only limited by the design specifications of the device. The IC chips over the leadframe 102 may be either stacked or placed laterally adjacent to one another.

By connecting the integrated circuit chip 108 to the down set inner leads 114, as shown in FIG. 1, the integrated circuit chip 108 rests within the cavity 122 formed by the down set transition leads 112 and the down set inner leads 114. The formation of the cavity 122 makes possible the use of the leadframe 102 with a thickness of about 0.203 mm or less, preferably between about 0.127 mm and about 0.152 mm.

FIG. 1 also shows the encapsulating material 124, such as, a molding compound, deposited over and between the leads 104, the paddle 106 and the integrated circuit chip 108. The encapsulating material 124 not only protects the integrated circuit package system 100 from contaminants, but it also provides structural integrity to the system as well. Notably, the additional down set of the paddle 106 increases the space between the integrated circuit chip 108 and the paddle 106, and thereby facilitates the filling of this space with the encapsulating material 124. The paddle 106 is physically separated and isolated from the integrated circuit chip 108 and the leads 104 by the encapsulation material 124. By enlarging the gap between the paddle 106 and the integrated circuit chip 108, incidences of delaminations or void formations are prevented and the use of special vacuum assisted molding machines are no longer required. The encapsulating material 124 and the molding techniques of the present invention are well known within the art and need not be repeated herein.

Figure 2:
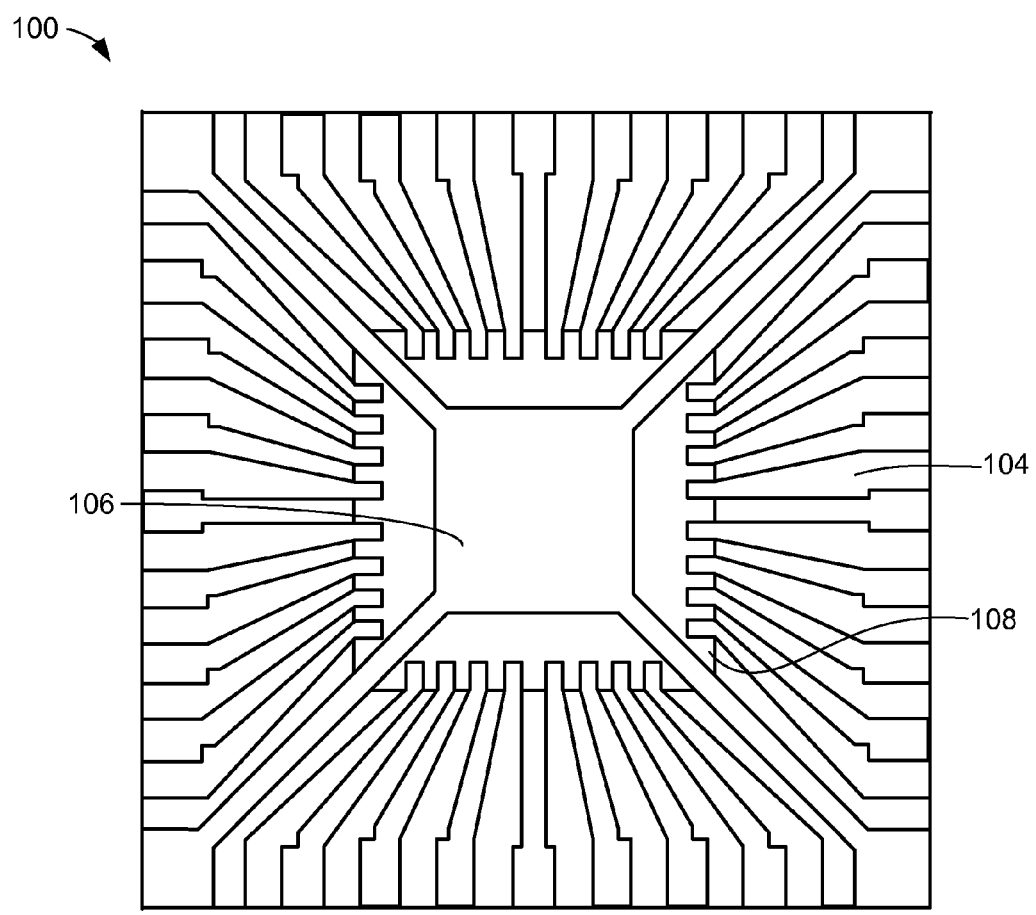
FIG. 2 is a top view of FIG. 1 in accordance with an embodiment of the present invention.

Referring now to FIG. 2, therein is shown a top view of FIG. 1 in accordance with an embodiment of the present invention. This view of the integrated circuit package system 100 depicts the leads 104, the paddle 106 and the integrated circuit chip 108.

FIGS. 3-9 are similar to FIGS. 1 and 2, and therefore, only the differences between the figures will be discussed to avoid redundancy.

Figure 3:
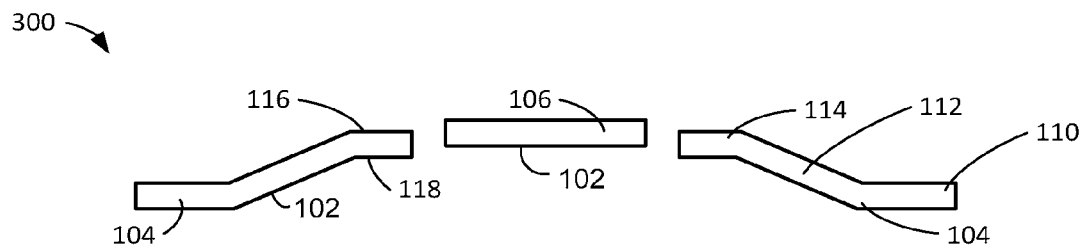
FIG. 3 is a cross-sectional view of a down set leadframe in accordance with an embodiment of the present invention.

Referring now to FIG. 3, therein is shown a cross-sectional view of a down set leadframe 300 in accordance with an embodiment of the present invention. The down set leadframe 300 includes the leadframe 102 comprised by the leads 104 and the paddle 106, such as, a down set paddle. The leads 104 are further comprised by the outer leads 110, the down set transition leads 112, the down set inner leads 114, the top surface 116 and the bottom surface 118. The down set inner leads 114 can be bent or down set to a depth of about 0.100 mm to about 1.000 mm below the plane established by the outer leads 110 and the paddle 106 can be bent or down set to a depth of about 0.150 mm to about 1.100 mm below the plane established by the outer leads 110.

By down setting the leads 104, the down set inner leads 114 no longer need to be half-etched to prevent exposure to the outside environment. Additionally, by eliminating half-etching, the leads 104 do not need to be made thicker to accommodate the stresses imparted by half-etching. By eliminating the need for a thicker lead design (i.e.—half-etching no longer needed), a thinner leadframe can be manufactured with a finer pitch. More specifically, by employing the methods of the present invention, an inner lead pitch design of about 0.200 mm or less is possible.

Figure 4:
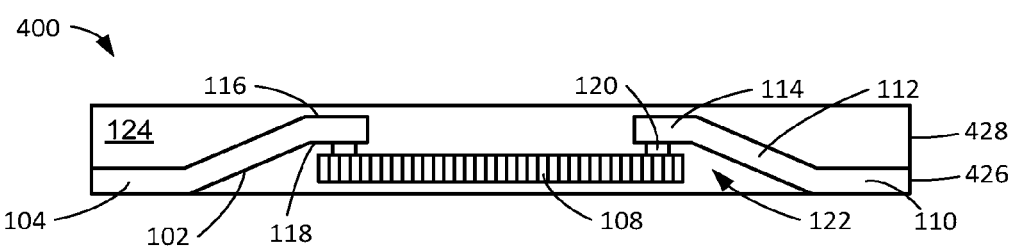
FIG. 4 is a cross-sectional view of an integrated circuit package system in accordance with another embodiment of the present invention.

Referring now to FIG. 4, therein is shown a cross-sectional view of an integrated circuit package system 400 in accordance with another embodiment of the present invention. The integrated circuit package system 400 includes the leadframe 102, the leads 104, the integrated circuit chip 108, the outer leads 110, the down set transition leads 112, the down set inner leads 114, the top surface 116, the bottom surface 118, the interconnections 120, the cavity 122 and the encapsulating material 124. In one embodiment, the integrated circuit chip 108 can be electrically connected to the bottom surface 118 of the down set inner leads 114 via only the interconnections 120, such as solder including solder balls, with only the interconnections 120 in between the integrated circuit chip 108 and the down set inner leads 114. An end surface 426 of the outer leads 110 is coplanar to a non-horizontal encapsulation side 428 of the encapsulating material 124. The leads 104 over chip design, of FIG. 4, which does not include the paddle 106 (not shown), can be commonly referred to as a paddleless leadframe, for example. By not forming the paddle 106, the overall size of the package can be made smaller. Additionally, by not forming the paddle 106, the encapsulating material 124 easily flows around the integrated circuit chip 108 and eliminates the need of a vacuum assisted molding process. By way of example, the integrated circuit chip 108 can overlap a portion of the down set inner leads 114 and the interconnections 120 can be formed by solder balls.

Figure 5:
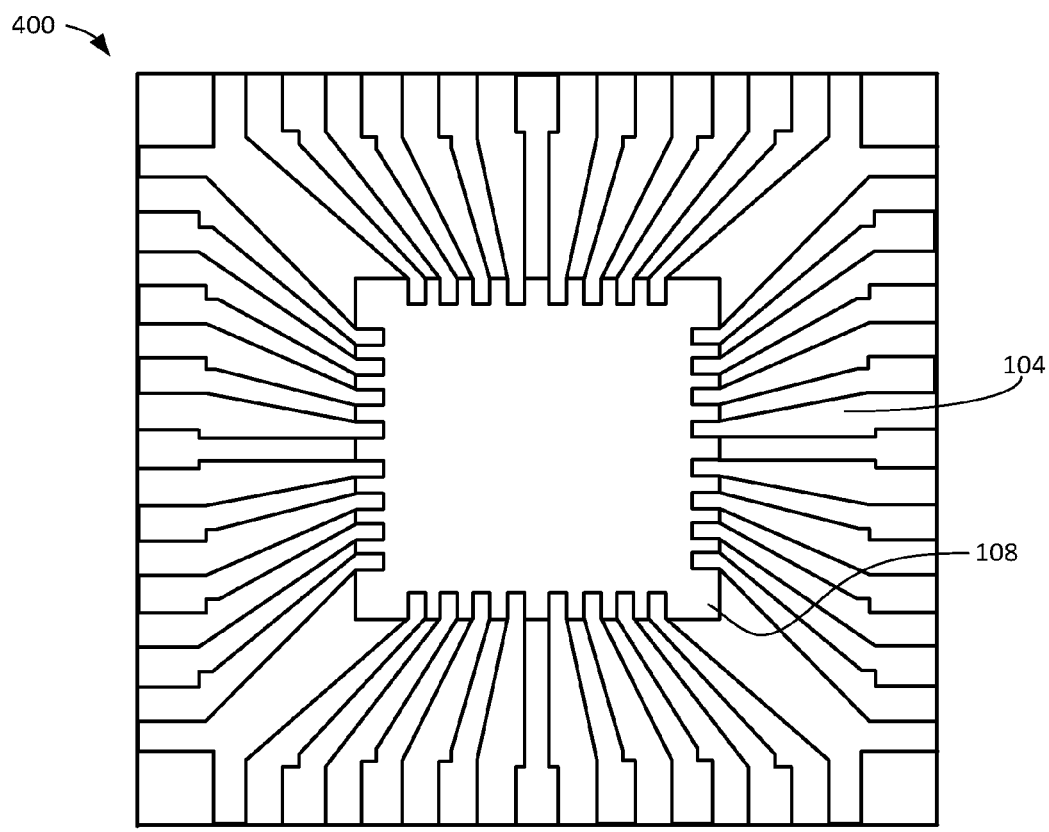
FIG. 5 is a top view of FIG. 4 in accordance with an embodiment of the present invention.

Referring now to FIG. 5, therein is shown a top view of FIG. 4 in accordance with an embodiment of the present invention. The integrated circuit package system 400 includes the leads 104 and the integrated circuit chip 108.

Figure 6:
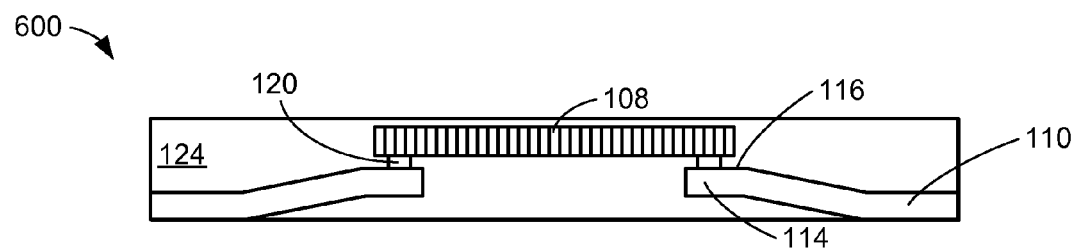
FIG. 6 is a cross-sectional view of an integrated circuit package system in accordance with another embodiment of the present invention.

Referring now to FIG. 6, therein is shown a cross-sectional view of an integrated circuit package system 600 in accordance with another embodiment of the present invention. This embodiment depicts the integrated circuit chip 108 formed above the down set inner leads 114. The integrated circuit chip 108 is electrically connected to the top surface 116 of the down set inner leads 114 via the interconnections 120. By way of example, the integrated circuit chip 108 can overlap a portion of the down set inner leads 114 and the interconnections 120 can be formed by solder balls. The down set inner leads 114 can be bent or down set to a depth of about 0.100 mm to about 1.000 mm below the plane established by the outer leads 110. Additionally, by not forming the paddle 106 (not shown), the encapsulating material 124 easily flows around the integrated circuit chip 108 and eliminates the need of a vacuum assisted molding process.

Figure 7:
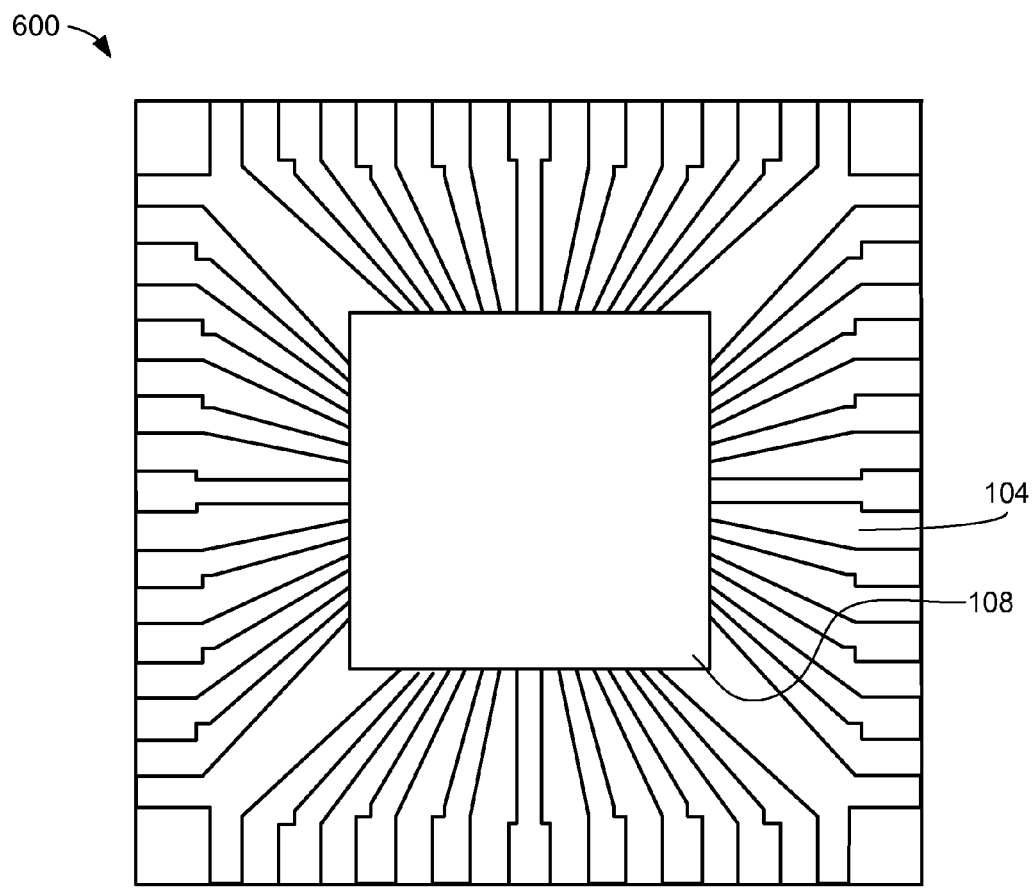
FIG. 7 is a top view of FIG. 6 in accordance with an embodiment of the present invention.

Referring now to FIG. 7, therein is shown a top view of FIG. 6 in accordance with an embodiment of the present invention. The integrated circuit package system 600 includes the leads 104 and the integrated circuit chip 108.

Figure 8:
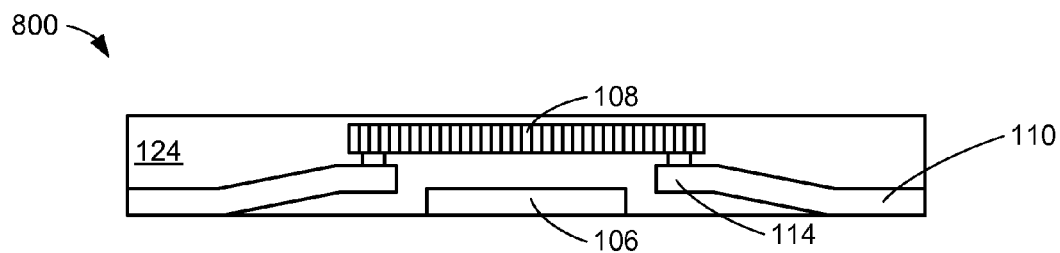
FIG. 8 is a cross-sectional view of an integrated circuit package system in accordance with another embodiment of the present invention.

Referring now to FIG. 8, therein is shown a cross-sectional view of an integrated circuit package system 800 in accordance with another embodiment of the present invention. This embodiment depicts the integrated circuit chip 108 formed above the down set inner leads 114 and the paddle 106. The integrated circuit chip 108 is electrically connected to the top surface 116 of the down set inner leads 114 via the interconnections 120. Although the down set inner leads 114 are down set to a depth of about 0.100 mm to about 1.000 mm below the plane established by the outer leads 110, the paddle 106 remains in the same plane as the outer leads 110. By not down setting the paddle 106, the gap between the integrated circuit chip 108 and the paddle 106 is enlarged, and the encapsulating material 124 easily fills the gap without special process steps, thereby reducing assembly costs.

Figure 9:
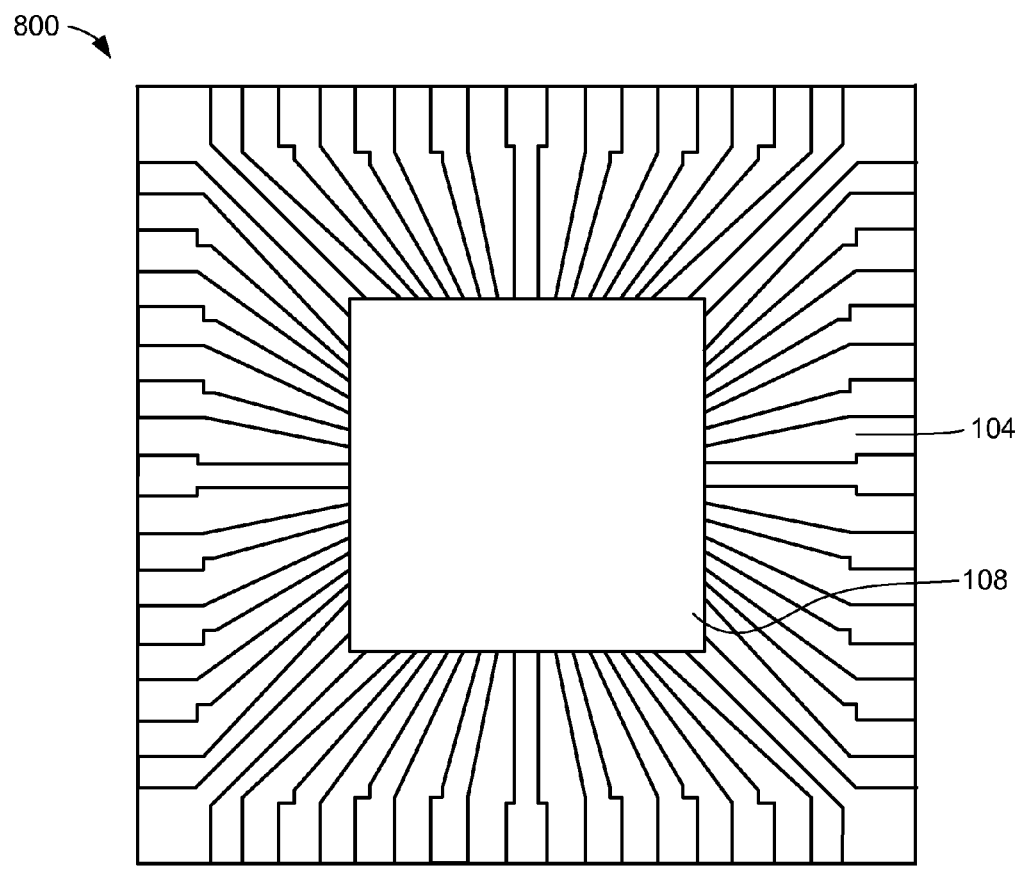
FIG. 9 is a top view of FIG. 8 in accordance with an embodiment of the present invention.

Referring now to FIG. 9, therein is shown a top view of FIG. 8 in accordance with an embodiment of the present invention. The integrated circuit package system 800 includes the leads 104 and the integrated circuit chip 108.

Figure 10:
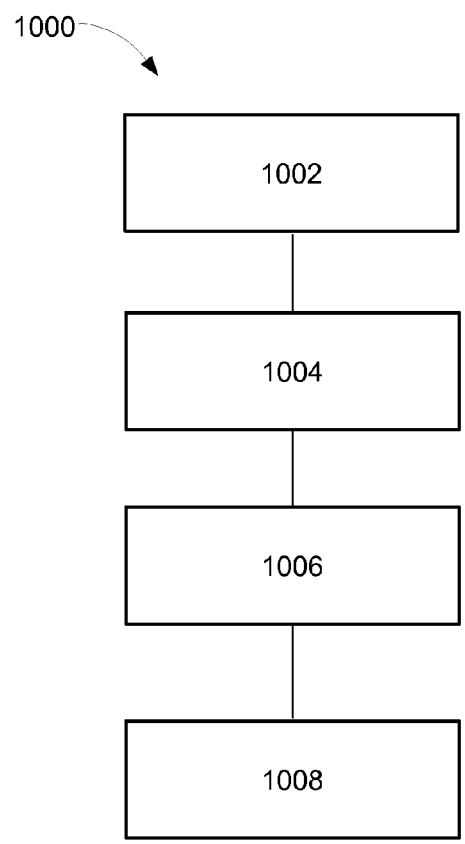
FIG. 10 is a flow chart for an integrated circuit package system for fabricating the integrated circuit package system in accordance with an embodiment of the present invention.

Referring now to FIG. 10, therein is shown a flow chart for an integrated circuit package system 1000 for fabricating the integrated circuit package system 100, 400, 600 or 800 in accordance with an embodiment of the present invention. The system 1000 includes providing a leadframe including leads configured to provide electrical contact between an integrated circuit chip and an external electrical source in a block 1002; configuring the leads to include outer leads, down set transitional leads, and down set inner leads in a block 1004; connecting the integrated circuit chip electrically to the down set inner leads in a block 1006; and depositing an encapsulating material to prevent exposure of the down set inner leads in a block 1008.

It has been discovered that the present invention thus has numerous aspects. An aspect of the present invention is that the down set leadframe makes possible the use of a thinner leadframe by eliminating the inner lead half-etch structure. By replacing the inner lead half-etch structure with a down set leadframe, a thinner more resilient leadframe may be produced.

Another aspect of the present invention is the enlargement of the gap between the integrated circuit chip and the paddle. Thus during encapsulation, the encapsulating material easily fills the enlarged gap without special process steps, and thereby reduces assembly costs.

Another aspect of the present invention is that the thinner leadframe, afforded by the down set leadframe process, allows a finer inner lead pitch design. By reducing the distance between adjacent leads, package with a greater number of input/output leads can be produced.

Yet another aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects. For instance, by forming a down set leadframe, a thinner package may be formed and the overall package size may be decreased. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package system for manufacturing an integrated circuit package comprising:
   providing a leadframe including a paddle and leads for providing electrical contact for an integrated circuit chip, the leads configured to include outer leads, down set transitional leads, and down set inner leads;
   configuring the integrated circuit chip to overlap a portion of the down set inner leads with electrical interconnects therebetween, the paddle physically isolated from the integrated circuit chip and the leads; and
   depositing an encapsulating material for preventing exposure of the down set inner leads, an end surface of the outer leads coplanar to a non-horizontal encapsulation side of the encapsulating material.

2. The system as claimed in claim 1 wherein:
   configuring the leads includes stamping the leads.

3. The system as claimed in claim 1 wherein:
   configuring the down set inner leads includes down setting the down set inner leads by about 0.100 mm to about 1.000 mm.

4. The system as claimed in claim 1 further comprising:
configuring the down set inner leads and the down set transition leads to form a cavity for retaining the integrated circuit chip.

5. The system as claimed in claim 1 wherein:
depositing the encapsulation material is facilitated by the structure of the leadframe.

6. An integrated circuit package system for manufacturing an integrated circuit package comprising:
providing a leadframe including a paddle offset from an integrated circuit chip and leads for providing electrical contact between the integrated circuit chip and an external electrical source, the leads including outer leads, down set transitional leads, and down set inner leads;
configuring the integrated circuit chip to overlap a portion of the down set inner leads with electrical interconnects therebetween, the paddle physically isolated from the integrated circuit and the leads; and
depositing an encapsulating material for preventing exposure of the down set inner leads, an end surface of the outer leads coplanar to a non-horizontal encapsulation side of the encapsulating material.

7. The system as claimed in claim 6 wherein:
depositing the encapsulating material is facilitated by the structure of the integrated circuit package system.

8. The system as claimed in claim 6 wherein:
configuring the leads includes forming a cavity for retaining the integrated circuit chip.

9. The system as claimed in claim 6 wherein:
configuring the leads includes a pitch design of about 0.200 mm or less.

10. An integrated circuit package system comprising:
an integrated circuit chip;
a leadframe including a paddle and leads configured for providing electrical contact for the integrated circuit chip, the paddle physically isolated from the integrated circuit chip and the leads and the leads configured to include outer leads, down set transitional leads, and down set inner leads;
an encapsulating material for preventing exposure of the down set inner leads, an end surface of the outer leads coplanar to a non-horizontal encapsulation side of the encapsulating material; and
wherein the integrated circuit chip is configured to overlap a portion of the down set inner leads with electrical interconnects therebetween.

11. The system as claimed in claim 10 wherein:
the integrated circuit chip includes a flip chip die.

12. The system as claimed in claim 10 wherein:
the down set inner leads are down set by about 0.100 mm to about 1.000 mm.

13. The system as claimed in claim 10 wherein:
the integrated circuit chip is electrically connected to a bottom surface of the down set inner leads.

14. The system as claimed in claim 10 wherein:
the integrated circuit chip is electrically connected to a top surface of the down set inner leads.

15. The system as claimed in claim 10 wherein:
the leadframe has a thickness of about 0.203 mm or less.

16. The system as claimed in claim 10 wherein:
the leadframe has a thickness between about 0.127 mm and about 0.152 mm.

17. The system as claimed in claim 10 further comprising:
a cavity for retaining the integrated circuit chip.

18. The system as claimed in claim 10 wherein:
the down set inner leads are configured to include a pitch design of about 0.200 mm or less.

19. The system as claimed in claim 10 wherein:
the integrated circuit package system facilitates deposition of the encapsulation material.

* * * * *

UNITED STATES PATENT AND TRADEMARK OFFICE
CERTIFICATE OF CORRECTION

PATENT NO. : 8,410,587 B2  
APPLICATION NO. : 12/544578  
DATED : April 2, 2013  
INVENTOR(S) : Lee et al.

Page 1 of 1

It is certified that error appears in the above-identified patent and that said Letters Patent is hereby corrected as shown below:

In the Claims:

Column 7, claim 6, line 18, delete "circuit and" and insert therefor
--circuit chip and--

Signed and Sealed this
Eighth Day of December, 2015

Michelle K. Lee
*Director of the United States Patent and Trademark Office*